United States Patent [19]

Roggwiller

[11] Patent Number: 4,943,840
[45] Date of Patent: Jul. 24, 1990

[54] REVERSE-CONDUCTING THYRISTOR

[75] Inventor: Peter Roggwiller, Riedt-Neerach, Switzerland

[73] Assignee: BBC Brown, Boveri & Company, Limited, Baden, Switzerland

[21] Appl. No.: 171,190

[22] Filed: Mar. 18, 1988

Related U.S. Application Data

[63] Continuation of Ser. No. 930,454, Nov. 14, 1986, abandoned.

[30] Foreign Application Priority Data

Nov. 29, 1985 [CH] Switzerland ............... 5095/85

[51] Int. Cl.[5] ........................................ H01L 29/747
[52] U.S. Cl. ........................... 357/39; 357/22; 357/38; 357/55; 357/56
[58] Field of Search ................. 357/39, 38, 22, 56, 357/55

[56] References Cited

U.S. PATENT DOCUMENTS

| | | | |
|---|---|---|---|
| 3,978,514 | 8/1976 | Ogawa et al. | 357/39 |
| 4,037,245 | 7/1977 | Ferro | 357/38 |
| 4,120,092 | 12/1986 | Bhagat | 357/38 |
| 4,150,391 | 4/1979 | Jaecklin | 357/39 |
| 4,357,621 | 11/1982 | Takeuchi et al. | 357/39 |
| 4,377,816 | 2/1983 | Sittig | 357/38 |
| 4,450,419 | 5/1984 | Yamamoto | 357/38 |
| 4,641,187 | 3/1987 | Sugimoto et al. | 357/52 |
| 4,672,415 | 6/1987 | Perndes et la. | 357/38 |
| 4,673,961 | 6/1987 | Nishizawa et al. | 357/38 |
| 4,742,377 | 5/1988 | Eindhoven | 357/52 |
| 4,788,615 | 6/1985 | Watanabe et al. | 357/38 |

FOREIGN PATENT DOCUMENTS

| | | | |
|---|---|---|---|
| 143259 | 6/1985 | European Pat. Off. | |
| 2824133 | 12/1978 | Fed. Rep. of Germany | 357/38 T |
| 2854174 | 6/1979 | Fed. Rep. of Germany | 357/38 T |
| 3046134 | 6/1982 | Fed. Rep. of Germany | 357/39 |
| 3612367 | 10/1987 | Fed. Rep. of Germany | 357/38 |
| 57-79471 | 7/1978 | Japan | 357/38 P |
| 54-143078 | 11/1979 | Japan | 357/39 T |
| 56-103416 | 8/1981 | Japan | 357/38 |
| 57-62561 | 4/1982 | Japan | 357/38 T |
| 58-40861 | 3/1983 | Japan | 357/39 T |
| 60-189262 | 9/1985 | Japan | 357/38 |
| 55-085077 | 6/1986 | Japan | 357/52 |
| 63-198383 | 8/1988 | Japan | 357/52 |
| 2660257 | 4/1981 | United Kingdom | 357/52 |

OTHER PUBLICATIONS

P. Debruyne et al., "The Reverse Conducting Thyristor and Its Appl.," Brown, Boveri Rev., vol. 66, #1, Feb. 1979, pp. 5–10.

Primary Examiner—Joseph E. Clawson, Jr.
Attorney, Agent, or Firm—Oblon, Spivak, McClelland, Maier & Neustadt

[57] ABSTRACT

A reverse-conducting thyristor having an integrated antiparallel diode, wherein an improvement of the switching characteristics is achieved by the fact that a field-controlled thyristor (FCT) is provided as the thyristor. According to a preferred illustrative embodiment, this FCT includes at the cathode side of the thyristor a plurality of alternately arranged n+-doped cathode regions and p-doped gate regions, the cathode regions being separated from each other by troughs over the bottoms of which the gate regions extend.

7 Claims, 2 Drawing Sheets

REVERSE-CONDUCTING THYRISTOR

This application is a Continuation of application Ser. Number 930,454, filed on Nov. 14, 1986, now abandoned.

BACKGROUND OF THE INVENTION

1. Field of the Invention

The present invention relates to a reverse-conducting thyristor such as is known, for example, from U.S. Pat. No. 4,150,391.

2. Discussion of Background

Reverse-conducting thyristors are understood to be integrated power semiconductors in which a thyristor structure and a diode structure are arranged next to each other on a common substrate in such a manner that the diode is electrically connected in antiparallel with the thyristor.

Such a thyristor is capable of accommodating blocking voltage only while it is short-circuited in the non-conducting direction by the antiparallel diode. Omission of a blocking p-n junction in the thyristor, connected with this, makes it possible to reduce the losses in the conducting direction and to reduce the circuit-commutated recovery time. The resultant advantages for application are described in detail, for example in Brown Boveri Review, Volume 66, No. 1, 1979, pages 5-10.

Although improvements have already been achieved with respect to the maximum switching frequency possible by integrating the antiparallel diode into a thyristor having the usual structure, it is, nevertheless, desirable to be able to switch at even higher frequencies, at powers which are at the same time high, as a result of which the range of applications of the reverse-conducting thyristor would be expanded.

It is also known that the so-called field-controlled thyristors (FCT), which have been described, for example, in European Patent application No. 0,121,068, are superior to the above-mentioned usual thyristors with respect to switching frequency.

SUMMARY OF THE INVENTION

Accordingly, one object of this invention is to provide a novel reverse conducting thyristor which is distinguished, in particular, by an improved maximum operating frequency.

The above object is achieved by providing a reverse-conducting thyristor of the type initially mentioned in which the thyristor section is constructed as a field-controlled thyristor.

By constructing the thyristor section as a FCT, the advantages of the combined antiparallel thyristor-diode structure and the advantages of the FCT are attained at the same time, which finds expression, in particular, in an increased maximum operating frequency.

In a reverse-conducting thyristor according to the invention, particularly advantageous control characteristics are achieved by the fact that, according to a preferred embodiment, the FCT contains a p+-doped FCT anode layer, a n⁻-doped channel layer lying above it and, on the cathode side, a plurality of alternately arranged n+-doped cathode-regions and p-doped gate regions, in which arrangement the cathode regions are separated from each other by troughs, the gate regions extend over the bottoms of the troughs, and the cathode regions have tops on which are provided FCT cathode contacts and the gate regions have tops on which are provided gate contacts in a gate plane.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
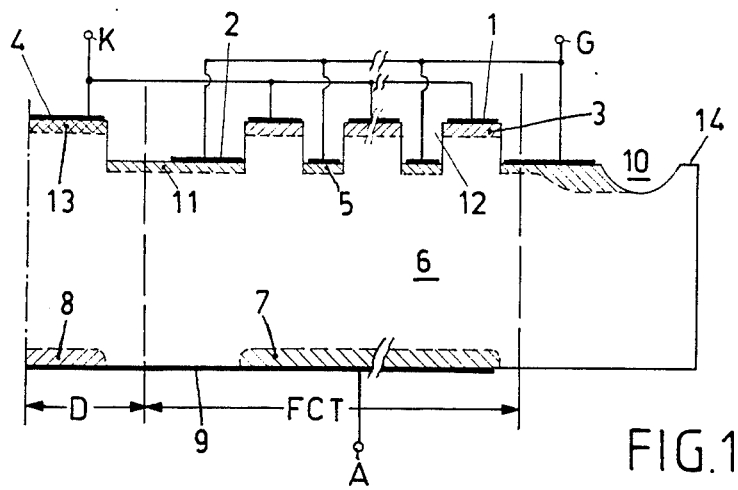
FIG. 1A is a schematic cross-sectional view of a reverse-conducting thyristor having a diode section lying on the inside of the device and gate regions which are restricted to trough bottoms according to a preferred illustrative embodiment of the invention.

Referring now to the drawings, wherein like reference numerals designate identical or corresponding parts throughout the several views, FIG. 1A shows a section of a cross-section of the structural construction of a reverse-conducting thyristor as produced for a preferred illustrative embodiment according to the invention, the figure representing only the right-hand half of the entire axially symmetrical cross-section. The overall structure is divided into a field-controlled thyristor FCT, lying on the outside, and a diode section D, lying on the inside. A n⁻-doped channel layer 6, extending from edge to edge right through the entire component is common to both part elements.

The anode A of the component is determined by the thyristor anode. This similarly applies to the cathode K and the thyristor cathode. Since the conditions are exactly reverse in the diode section D because of the antiparallel circuit, the corresponding electrode of the composite component of the invention and thus also of the thyristor, will always be meant in the text which follows when the term "anode-side" or "cathode-side" is used.

The diode section D is provided with three layers lying on top of each other, the lower one of which being a n+emitter layer 8, the center one being the n⁻-doped channel layer 6, already mentioned, and the top one being a p+-doped diode-anode layer 13. Whereas the channel layer 6 extends through the entire component, the lateral extent of the n+emitter layer 8 and of the diode-anode layer 13 is restricted to the region of the diode section D.

In principle, the field-controlled thyristor FCT in FIG. 1A corresponds to that known from European Patent Application No. 0,121,068. It comprises a p+-doped FCT anode layer 7, the n⁻-doped channel layer 6, laying above it, and, on the cathode side, a finely subdivided gate-cathode structure which is composed of alternately arranged p-doped gate regions 5 and n+- doped cathode regions 3. To supply the load current, FCT cathode contacts 1 and anode contact 9 are provided which are usually constructed as vapor-deposited metal layers.

Just as the n+ emitter layer 8 is restricted in its lateral extent to the region of the diode section D arranged in the center of the component, the FCT anode layer only extends within the region of the field-controlled thyristor FCT.

The individual cathode regions 3 are separated from each other by deep troughs 12. The gate contacts 2 are arranged at the bottoms of the troughs 12. The p-doped gate regions 5 also extend over the trough bottoms in the illustrative embodiment of FIG. 1A.

The operation of the field-controlled thyristor FCT is known per se. By applying a negative gate voltage between gate G and cathode K depletion regions are created at the p-n junction between the gate regions 5 and the channel layer 6, which extend into the channel region between the gate regions 5 and constrict the current flowing between FCT anode layer 7 and the cathode regions 3 until it is blocked. The total anode voltage is then dropped across the thyristor element. The ratio between this voltage and the gate voltage is called turn-off gain and is dependent in a complicated manner on the various degrees of doping and geometric dimensions of the component.

Whilst, at the anode side, a common anode contact 9, which largely covers both the n+ emitter layer 8 and the FCT anode layer 7, is preferably provided for the diode section D and the field-controlled thyristor FCT, a wide gate zone 11, which is not faced by any region of the n+ emitter layer 8 at the anode side, is provided at the cathode side for electrically decoupling the diode and the thyristor. In this arrangement, the width of the gate zone 11 is preferably selected to be at least as large as the thickness of the component.

The gate contacts 2, in turn, which are all located in one gate plane 14, form a coherent contact layer so that the electric connection can be made in a simple manner in the freely accessible edge region. These conditions are also only diagrammatically indicated in FIG. 1A, by the line connections drawn in.

Figure 1B:
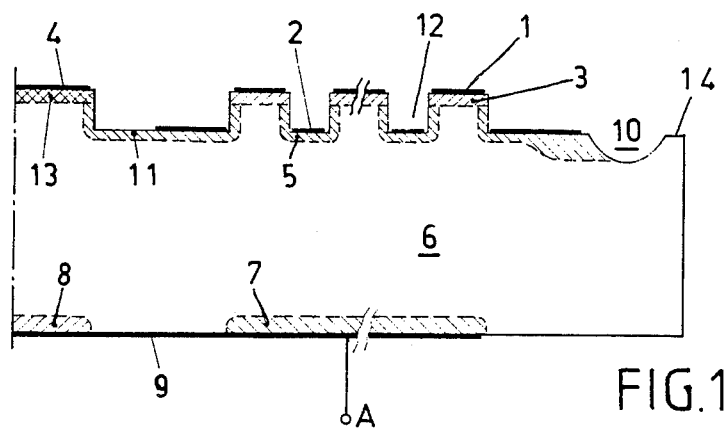
FIG. 1B is a schematic cross-sectional view of the configuration according to FIG. 1A having gate regions which are extended to the trough walls.

Another preferred illustrative embodiment for a reverse-conducting thyristor according to the invention is shown in FIG. 1B in a manner analogous to FIG. 1A. To simplify matters, the cathode-side diagrammatic connecting lines have here been omitted. The same applies for the subdivision into diode section and thyristor section.

The difference between the two structures shown in FIG. 1A and FIG. 1B consists in the fact that, in the latter, the gate regions 5 extend both over the trough bottoms and over the side walls of the trough. This achieves an improved turn-off gain for the field-controlled thyristor FCT.

Thus, a turn-off gain of over 100 is obtained with a thyristor structure according to FIG. 1B for a width of the cathode regions 3 of 30 μm, a thickness of the component of 300 μm and a n−-doping concentration in the channel layer 6 of $3.5 \times 10^{13}$ cm$^{-3}$ (=150 .cm) with an anode voltage of 1600 V. In this arrangement, a determining role is played by the trough depth, on the one hand, and, on the other hand, the depth of the p-n junction between gate region 5 and channel layer 6. A depth of the troughs 12 of from 10 μm to 30 μm, a width of the cathode regions 3 of from 6 μm to 40 μm and a thickness of the gate regions 5 of from 5 μm to 20 μm have been found to be particularly favorable. The edge concentration of the p-doping in the gate regions 5 should not exceed $2 \times 10^{16}$ cm$^{-3}$ so that the p-n junction between cathode regions 3 and gate region 8 can accommodate, that is to say block, a negative gate voltage of up to 50 V.

Figure 2:
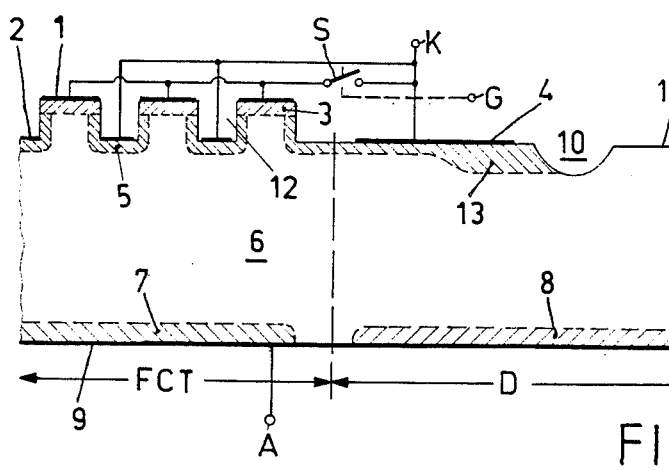
FIG. 2 is a schematic cross-sectional view of a reverse-conducting thyristor according to another preferred illustrative embodiment, having a diode section lying on the outside, for application in cascade circuits.

Another preferred illustrative embodiment of a reverse-conducting thyristor having an FCT thyristor section, which is intended to be used in a cascade circuit, is shown in FIG. 2. However, before discussing this illustrative embodiment in greater detail, the principle of the above-mentioned cascade circuit will first be explained with the aid of FIG. 3.

Figure 3:
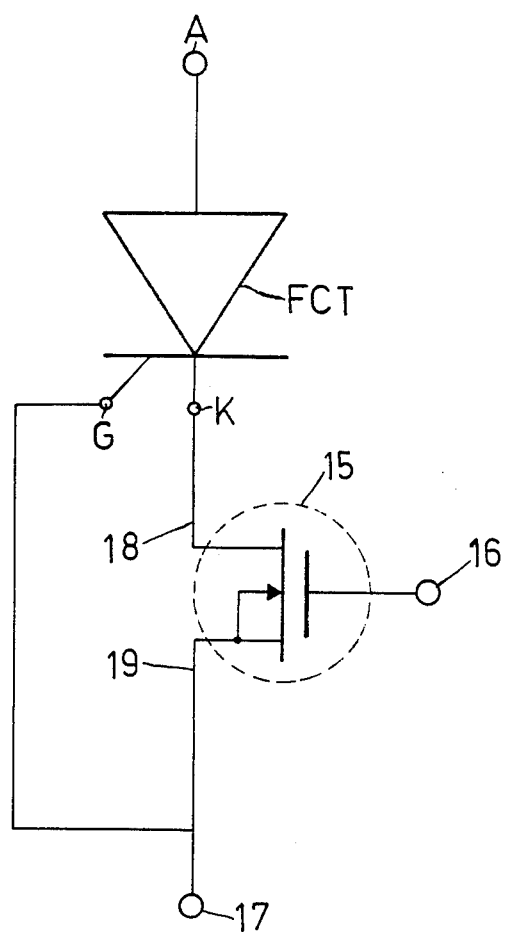
FIG. 3 is a schematic circuit diagram of a cascade circuit consisting of a FCT and a power MOSFET for a component according to FIG. 2.

The cascade circuit, which has been known for a long time in connection with thyristors (see, for example, "Lexikon der Elektronik" (Lexicon of Electronics), Frieder. Vieweg & Sohn, Braunschweig/Wiesbaden 1983, page 228 and 229), according to FIG. 3, is composed of a field-controlled thyristor FCT (drawn without antiparallel diode in this case for the sake of simplicity) and of a power MOSFET 15 of a type of construction known per se, the source 18 and drain 19 of which is connected together to gate G and cathode K of the FCT in the manner shown.

In this arrangement, the MOSFET gate forms the cascade gate 16 whilst gate G of the FCT and drain 19 of the power MOSFET 15, together, represent the test cascade cathode 17.

The essential advantages of this cascade circuit consist in that the component is gated via the MOS gate of the power MOSFET, with low power consumption, and high switching frequencies can be achieved.

Combining drain 19 and gate G in the cascade circuit results in a simplified method for integrating the antiparallel diode according to FIG. 2.

As can be seen in FIG. 2, the diode section D of the component is here arranged in the edge region whilst the field-controlled thyristor FCT is in the center. The FCT has the same doping zones and the same geometric structure as in FIGS. 1A and 1B. It is true that the gate regions 5 in the illustrative embodiment of FIG. 2 also extend over the side walls of the troughs 12 analogously to FIG. 1B. However, analogously to FIG. 1A, provision can also be made for restricting the gate regions 5 only to the trough bottoms.

In contrast to the illustrative embodiments of FIGS. 1A and 1B, the diode section D of FIG. 2 has a p-doped diode-anode layer 13 which makes contact with the diode-anode contact 4 not in the plane of the FCT cathode contacts 1 but in the gate plane 14 lying underneath. As a result, the diode-anode contact 4 and the gate contacts 2 serving as a main contact can be constructed as coherent contact layer and thus the required electric contact between the two can be established.

As also diagrammatically indicated in FIG. 2, the FCT cathode contacts 1 are connected via the power MOSFET, shown as switch S, from FIG. 3 to the cathode K of the component which corresponds to the test cascade cathode 17 from FIG. 3.

Since the diode-anode layer 13 is restricted to the free edge region of the component in the illustrative embodiment of FIG. 2, it can be constructed in a simple manner as an alloying contact.

In all illustrative embodiments described, it is also of advantage to provide at the edge of the component an edge profile 10, shown in the figures, which is intended to restrict the influence of the edge on the electric operation of the component.

Overall, the reverse-conducting thyristor according to the invention provides a component for power electronics which is distinguished by simplified construction and by rapid switching of high powers with good gating characteristics.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A reverse-conducting thyristor having a center, a thyristor section and an antiparallel connected diode section integrated on a common substrate, wherein the thyristor (FCT) comprising a p$^+$-doped FCT anode (FCT), said reverse-conducting thyristor having opposed cathode and anode sides, said field-controlled thyristor (FCT) comprising a p$^=$-doped FCT anode layer on the anode side, an n$^-$-doped channel layer lying above the anode layer in a direction towards the cathode side, and, on the cathode side, a plurality of alternately arranged n$^+$-doped cathode regions and p-doped gate regions, the cathode regions being separated from each other at the cathode side by troughs having side walls and a bottom, said side walls extending from said bottom in the direction towards the cathode side, the gate regions extending across the bottoms of the troughs and defining thereby an interdigitated gate/cathode structure, the cathode regions having top portions on which are provided FCT cathode contacts and the gate regions having portions on which are provided gate contacts in a gate plane;
said diode section arranged in the center of the reverse-conducting thyristor;
the FCT anode layer restricted to a region of the field-controlled thyristor (FCT) on the anode side outside said center;
an n$^+$ emitter layer diffused into the diode section at the anode side;
a p$^+$-doped diode-anode of the diode section layer arranged at the cathode side, wherein the p$^+$-doped anode and the n$^-$-doped channel form a diode pn-junction, said p$^+$-doped diode-anode layer together with the channel layer extending through the diode section and with said n$^+$ emitter layer forming a diode;
said p$^+$-doped diode-anode layer electrically connected to the FCT cathode contact via an applied diode-anode contact;
a common anode contact provided at the anode side and extending over the field-controlled thyristor (FCT) and the diode section; and
a gate separation zone including a separating p-doped gate region contacted by a gate contact provided on the cathode side between the field-controlled thyristor (FCT) and the diode section so that the field-controlled thyristor and diode section are decoupled from each other, said gate separation zone having a width at least equal to the thickness of the field-controlled thyristor.

2. A reverse-conducting thyristor as claimed in claim 1, wherein the gate regions also extend over the side walls of the troughs.

3. A reverse-conducting thyristor as claimed in claim 2, comprising:
the side walls of the troughs extending perpendicular to their respective bottoms,
the troughs having a depth of between 10 $\mu$m and 30 $\mu$m,
the cathode regions having a width of between 6 $\mu$m and 40 $\mu$m,
the gate contacts applied above the gate regions forming a coherent contact layer,
the gate regions having a width of between 5 $\mu$m and 20 $\mu$m, contacting with the cathode regions, and having a maximum doping concentration of $2 \times 10^{16}$ cm$^{-3}$ at an edge.

4. A reverse-conducting thyristor having a central region, an edge region, a thyristor section and an antiparallel connected diode section integrated on a common substrate, wherein the thyristor section comprises a field-controlled thyristor (FCT), said reverse-conducting thyristor having opposed cathode and anode sides, said field-controlled thyristor (FCT) comprising a p$^+$-doped FCT anode layer on the anode side, an n$^-$-doped channel layer lying above the anode layer in a direction towards the cathode side, and, on the cathode side, a plurality of alternately arranged n$^+$-doped cathode regions and p-doped gate regions, the cathode regions being separated from each other at the cathode side by troughs having side walls and a bottom, said side walls extending from said bottom in the direction towards the cathode side, the gate regions extending across the bottoms of the troughs and defining thereby an interdigitated gate/cathode structure, the cathode regions having top portions on which are provided FCT cathode contacts and the gate regions having portions on which are provided gate contacts in a gate plane;
the diode section arranged at the edge portion,
the FCT anode layer restricted to an area opposite the FCT cathode and the gate regions,
said diode section comprising an n$^+$ emitter layer diffused into n$^-$-channel layer at the anode side and, on the cathode side of the diode section, a p-doped diode-anode layer, the p-doped diode-anode layer electrically connected to the FCT gate contact via an applied diode-anode contact located in a gate plane,
a gate separation zone including a separating p-doped gate region contacting a gate contact provided on the cathode side between the field-controlled thyristor (FCT) and the diode section so that the field controlled thyristor (FCT) and the diode section are decoupled from each other, said gate separation zone having a width at least equal to the thickness of the field controlled thyristor, and
a common anode contact provided at the anode side and extending over the field-controlled thyristor and the diode section.

5. A reverse-conducting thyristor as claimed in claim 4, wherein the p-doped diode-anode layer is constructed as an alloying contact.

6. A reverse-conducting thyristor as claimed in claim 4, wherein the gate regions also extend over the side walls of the troughs.

7. A reverse-conducting thyristor as claimed in claim 6, comprising:
the side walls of the troughs extending perpendicular to their respective bottoms,
the troughs having a depth of between 10 $\mu$m and 30 $\mu$m,
the cathode regions having a width of between 6 $\mu$m and 40 $\mu$m,
the gate contacts applied above the gate regions forming a coherent contact layer,
the gate regions having a width of between 5 $\mu$m and 20 $\mu$m, contacting with the cathode regions, and having a maximum doping concentration of $2 \times 10^{16}$ cm$^{-3}$ at an edge.

* * * * *